United States Patent
Schröder et al.

(10) Patent No.: US 6,735,138 B2
(45) Date of Patent: May 11, 2004

(54) INTEGRATED MEMORY USING PREFETCH ARCHITECTURE AND METHOD FOR OPERATING AN INTEGRATED MEMORY

(75) Inventors: Stephan Schröder, München (DE); Manfred Dobler, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/446,601

(22) Filed: May 28, 2003

(65) Prior Publication Data

US 2003/0223300 A1 Dec. 4, 2003

(30) Foreign Application Priority Data

May 28, 2002 (DE) .......................... 102 23 726

(51) Int. Cl.$^7$ ................................. G11C 7/00
(52) U.S. Cl. .................... 365/219; 365/63; 365/189.12; 365/221
(58) Field of Search .............. 365/63, 219, 221, 365/189.12, 230.03, 233

(56) References Cited

U.S. PATENT DOCUMENTS 5,995,404 A 11/1999 Nakaumura et al.
6,512,719 B2 * 1/2003 Fujisawa et al. ............. 365/233
6,606,277 B2 * 8/2003 Takahashi .................... 365/233

OTHER PUBLICATIONS

R. F. Meyers et al.: "Performance Partitioned DRAM–P$^2$RAM", IBM Technical Disclosure Bulletin, vol. 27, No. 1A, Jun. 1984, pp. 37–38.

* cited by examiner

Primary Examiner—Son T. Dinh
(74) Attorney, Agent, or Firm—Laurence A. Greenberg; Werner H. Stemer; Gregory L. Mayback

(57) ABSTRACT

An integrated memory comprises a memory cell array with memory cells and a connection area for externally tapping data of the memory cells which are to be read out. The memory is operated using a prefetch architecture, in which, when there is a memory access operation, a first data group of memory cells from a first zone and a second data group of further memory cells from a second zone of the memory cell array are fed in parallel to an output circuit and the first and second data groups are output successively via the connection area. The first and second zones are always defined for a plurality of memory access operations in such a way that the first data group has a shorter signal transit time to the connection area than the second data group. As a result, the external outputting of data can be brought forward in time, and the operating frequency can thus be increased.

9 Claims, 2 Drawing Sheets

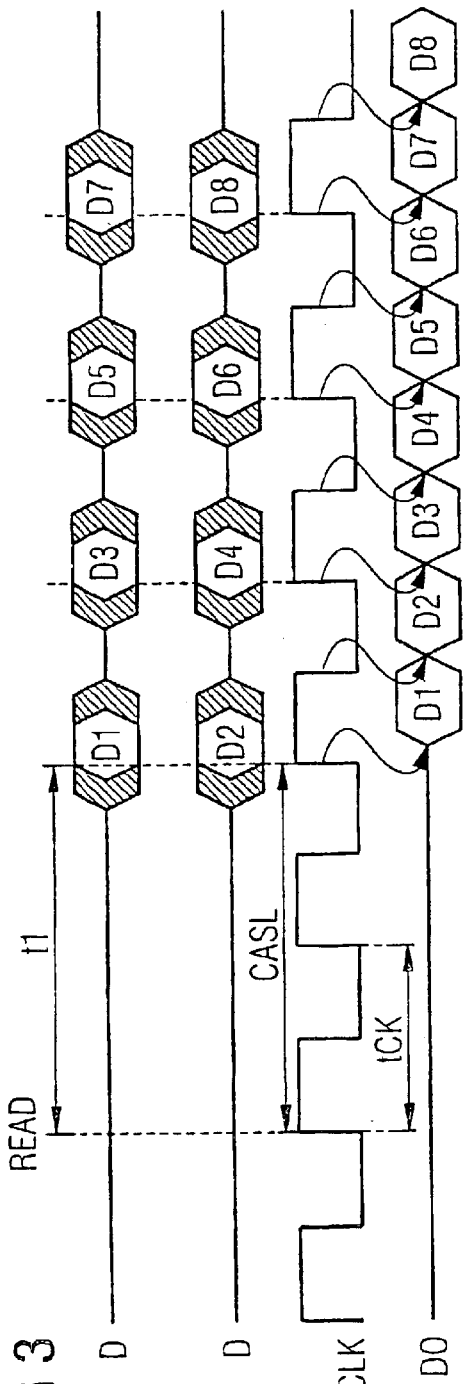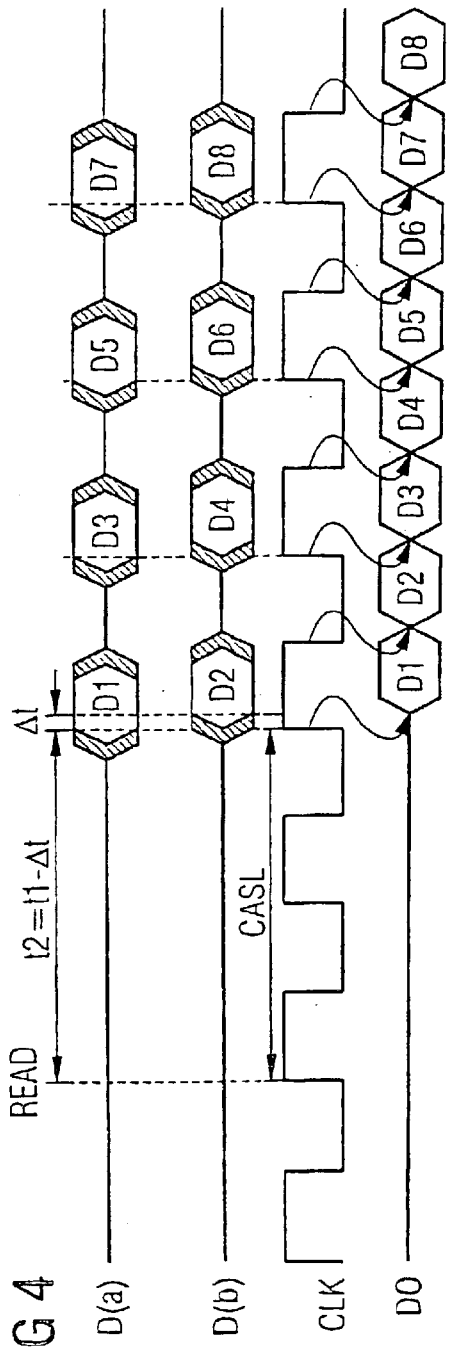

INTEGRATED MEMORY USING PREFETCH ARCHITECTURE AND METHOD FOR OPERATING AN INTEGRATED MEMORY

BACKGROUND OF THE INVENTION

Field of the Invention

The invention lies in the integrated technology field. More specifically, the present invention relates to an integrated memory having memory cells that are arranged in a memory cell array, and having a connection area for externally tapping data of the memory cells which is to be read out. The memory is designed using so-called prefetch architecture, in which data from different zones of the memory cell array is fed in parallel from the memory cell array to an output circuit. The invention also relates to a method for operating such an integrated memory.

Integrated memories, in particular so-called DRAMs (Dynamic Random Access Memories) using what is referred to as double data rate architecture (DDR DRAMs) have comparatively high switching and access speeds. Such integrated memories generally have a clock signal for controlling the operating sequence of such a memory. In contrast with so-called single data rate DRAMs, two data packets are output in DDR DRAMs within one clock cycle, namely a first data packet with the rising edge of the clock signal and a second data packet with the falling edge of the clock signal.

Such DDR DRAMs are typically configured with a prefetch architecture in order to be able to ensure the high data rate. In a prefetch architecture, data from different zones of the memory cell array are fed in parallel from the memory cell array to a read/write amplifier and then to an output circuit. After evaluation, the data that are to be output are buffered by the write/read amplifier in an output register so that the data which are received in parallel are then output in serial form within one clock cycle by way of an off-chip driver. The outputting is subsequently carried out at twice the data rate.

A limiting factor for the maximum speed during the accessing of data here is that during the outputting of data it is necessary to comply with a time period, referred to as the CAS latency, in order to ensure reliable reading out of data. This means that after a read instruction is applied, the system must wait for a certain time period until the outputting of data to outside the memory cell array can start. The need to wait for this time period is due to the fact that the data requires a certain time from the outputting from the memory cell array until the output register is reached. According to the definition of what is referred to as the CAS latency, a data packet is read into the output register at a defined time during a read access operation. In synchronous memories, the CAS latency is usually programmed by a mode register set instruction. It is programmed and set here as a function of the operating frequency of the memory in order to obtain an optimum data throughput rate at every operating frequency during a read access operation.

SUMMARY OF THE INVENTION

It is accordingly an object of the invention to provide an integrated memory device with prefetch architecture and a method of operating such a memory which overcome the above-mentioned disadvantages of the heretofore-known devices and methods of this general type and wherein a further increase in the operating frequency, and thus in the data processing speed, is made possible. Furthermore, it is an object of the present invention to make available a method for operating an integrated memory, as mentioned at the beginning, using prefetch architecture, which permits an increased operating frequency and thus an increased data processing speed of the memory.

With the foregoing and other objects in view there is provided, in accordance with the invention, an integrated memory, comprising:
- a plurality of memory cells arranged in a memory cell array having a first zone and a second zone;
- a connection area for externally tapping data of the memory cells to be read out;
- an output circuit connected between the memory cells and the connection area, the output circuit, during a memory access operation with prefetch:
    receiving a first data group from the memory cells in the first zone and a second data group from the memory cells in the second zone in parallel; and
    outputting the data of the first and second data groups successively in series via the connection area;
- and an address decoder for defining the first and second zones for a plurality of memory access operations such that the first data group has a shorter signal transit time to the connection area than the second data group.

With the above and other objects in view there is also provided, in accordance with the invention, a method of operating the memory in a prefetch architecture, which comprises:
- during a memory access operation, feeding a first data group of memory cells from the first zone and a second data group of memory cells from the second zone of the memory cell array in parallel to an output circuit, and outputting the first and second data groups successively via the connection area; and
- defining the first and second zones for a plurality of memory access operations such that the first data group has a shorter signal transit time to the connection area than the second data group.

In accordance with a preferred embodiment of the invention the first and second zones are defined such that the memory cells containing the first data group are disposed physically closer to the connection area than the memory cells containing the second data group.

In other words, according to the invention, the integrated memory is configured using a prefetch architecture, in which, on occasion of a memory access operation, a first data group of memory cells from a first zone and a second data group of further memory cells from a second zone of the memory cell array are fed in parallel to an output circuit and the first and second data groups are output successively via the connection area. While the memory is operating, the first and second zones are always defined for a plurality of memory access operations in such a way that the first data group has a shorter signal transit time to the connection area than the second data group. This definition of the first and second zones is performed in particular by means of an address decoder. In this way, by firstly outputting the first data group and then the second data group via the connection area for the memory access operation it is possible to increase the operating frequency of the memory. In comparison to the second data group, the first data group always has a shorter signal transit time to the connection area of the memory. As a result, the outputting of data to outside the memory with the first data group can be brought forward. With respect to the second data group, a prolonged signal transit time is sufficient even at relatively high operating frequencies as the data group is not output until after the first data group. As a result, a longer time period is available for reading out via the connection area for the second data group.

In accordance with an added feature of the invention, the first and second zones are defined by means of the address decoder in such a way that the memory cells which store the first data group are arranged physically closer to the connection area than the memory cells which store the second data group. The first data group thus has a physically shorter path to the connection area, while the second data group has the longer path to the connection area. The first data group thus reaches the connection area with a shorter signal transit time than the second data group.

In accordance with an additional feature of the invention, at least one output signal is provided which is used to output the data groups via the connection area and can be driven so as to output before the second data group is valid for outputting at the connection area. The first data group can thus already be output while the second data group is still en route to the connection area, and is only output subsequently.

In accordance with a concomitant feature of the invention, respective register circuits which are used to buffer the data groups before they are output externally are arranged in the connection area. In order to obtain the highest possible operating frequencies it is advantageous if the respective register circuit is driven by a control signal so as to output data as soon as the first data group is valid at this register circuit.

Other features which are considered as characteristic for the invention are set forth in the appended claims.

Although the invention is illustrated and described herein as embodied in an integrated memory using prefetch architecture and method for operating an integrated memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a signal diagram relating to the operation of a memory with double prefetch operation; and FIG. 4 is a signal diagram relating to the operation of a memory with double prefetch according to the invention.

DESCRIPTION OF THE PREFERRED EMBODIMENTS

Figure 1:
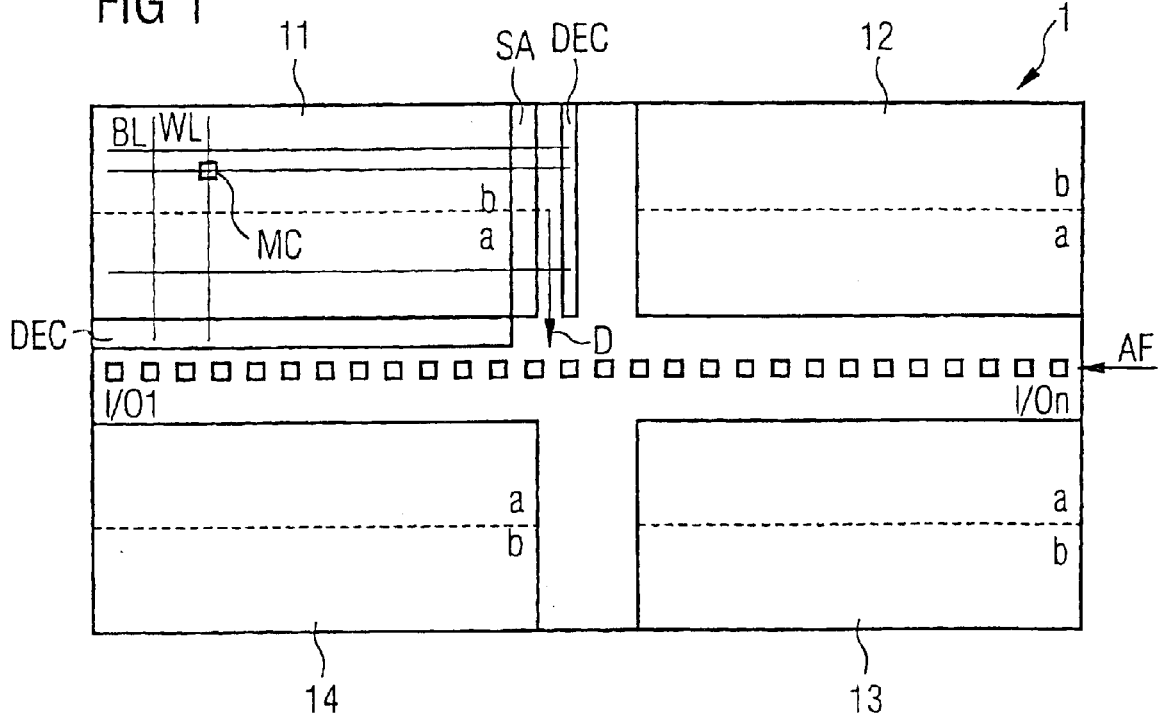
FIG. 1 is a schematic plan view of an exemplary embodiment of a memory device according to the invention.

Referring now to the figures of the drawing in detail and first, particularly, to FIG. 1 thereof, there is shown a schematic view of a DDR DRAM with a plurality of memory cell blocks. In the present exemplary embodiment, the memory 1 has four memory cell blocks 11 to 14 in the form of quadrants which represent the entire memory cell array. The individual memory cell blocks 11 to 14 each have word lines WL and bit lines BL. Memory cells MC are arranged at points of intersection of the word lines WL and bit lines BL. The basic design of the memory cell blocks 11 to 14 is illustrated by way of example in a schematic and highly simplified form by way of the memory cell block 11. In order to read out data, selection transistors of respective memory cells are switched on by means of an activated word line, as a result of which a data signal of a correspondingly selected memory cell can then be read out. For this purpose, the memory cells are connected via the selection transistor to one of the bit lines via which the corresponding data signal is fed to a respective write/read amplifier SA for evaluation and amplification. The data D to be read out of the memory cell array are fed to a connection area AF for external tapping.

Figure 2:
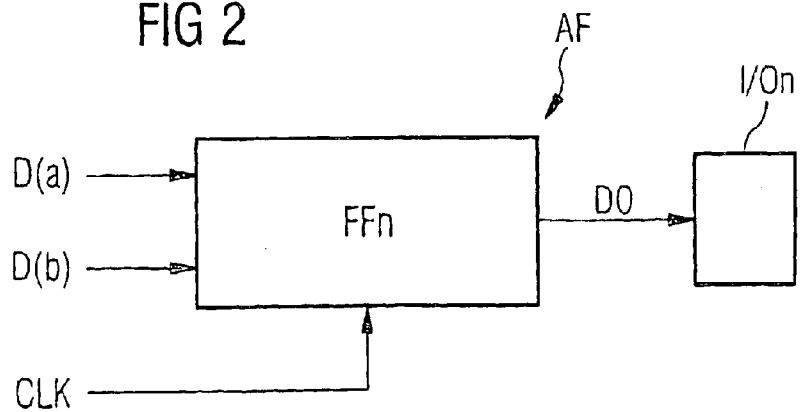
FIG. 2 is a block diagram of an output circuit for outputting a plurality of data groups as a component of the memory according to FIG. 1.

The connection area AF has data connection pads in the form of I/O pads which, in the case of the memory according to FIG. 1, are arranged in series in the center of the memory 1 between the quadrants 11, 12 and 13, 14. Furthermore, in the memory according to FIG. 1, output circuits which are not illustrated are provided in the form of respective register circuits. An embodiment of such a register circuit is illustrated by way of example in FIG. 2. Here, a register circuit FF in the form of a FIFO register is assigned to each connection pad I/O1 to I/On. The FIFO registers have a plurality of data inputs for feeding in data D, and a control input to which a clock signal CLK is fed. An output of the respective register circuits is connected to the respective connection pad I/O1 to I/On in order to emit output data DO. Such connections are illustrated by way of example in FIG. 2 by means of the connections of the register circuit FFn to the connection pad I/On. The FIFO register circuits are arranged in the direct vicinity of the connection pads I/O1 to I/On.

In typical DDR DRAM architectures, the different memory cell blocks are accessed randomly in order to output data. Here, when there is a memory access operation according to a double prefetch architecture, different data groups from different zones of the memory cell array are fed in parallel from the memory cell array to an output circuit and are successively output with rising and falling edges of the clock signal of the memory via the connection area. An access operation is typically carried out by means of a read instruction which causes data to be fed from memory cells to the connection area via local sense amplifiers and also via secondary sense amplifiers. The data to be output are buffered in the FIFO registers and output in serial fashion with the rising and falling edges of the clock signal of the memory via the connection pads. Here, it is necessary to ensure that all the data are present in the respective FIFO register circuit before they can be output with the clock signal with rising and falling edges.

FIG. 3 illustrates, by way of example, such a reading out process by means of a signal diagram relating to the operation of a memory with double prefetch. After the read instruction READ has been applied, data D are read out in parallel from respective memory cell blocks. In the present memory, a CAS latency CASL of two clock periods tCK is defined, that is to say the system waits for a time period of two clock cycles after the application of the read instruction READ before the outputting of data to the outside of the memory starts. The CAS latency specifies the number of clock cycles for which the system waits with respect to the start of the read access operation to read out the data D from the memory. If two clock cycles have passed after the application of the read instruction READ, the outputting of data starts at the output of the respective register circuit in which the data D are buffered. The data groups D1, D3, D5, D7 and D2, D4, D6 and D8 which are fed in parallel to the respective register circuit are successively output with rising and falling clock edges of the clock signal CLK via the respective connection pad I/O. Before the outputting, the system must wait for a certain time until the data are valid (in FIG. 3 the grey region before the start of the outputting of the data), owing to the different data bit transit times.

A signal diagram relating to the operation of a memory with double prefetch according to the invention is shown in FIG. 4. Here, the cell array or the memory cell blocks 11 to 14 from FIG. 1 are respectively divided into two areas a and b for the data access operation. Such areas a and b are indicated schematically in FIG. 1. When a memory access operation takes place, the data group D1 is read out of the zone a of a memory cell block (data D(a)), and the data group D2 from the zone b (data D(b)). The data groups D1 and D2 are fed in parallel to the respective register circuit for external outputting. The zones a and b are defined according to the invention by means of the address decoder in such a way that the data group D1 has a shorter signal transit time to the connection area AF than the data group D2. The same applies to the following data groups illustrated. This is achieved in the present exemplary embodiment by virtue of the fact that the memory cells which store the data group D1 (zone a) are arranged physically closer to the connection area AF than the memory cells which store the data group D2 (zone b). As a result, the data group D1 has the shorter signal path as compared to the data group D2.

As exclusively data of the zone a with correspondingly short signal transit times are output with the data group D1 (comparatively small gray area), the data group D1 can be output Δt earlier in comparison to the outputting of the data D1 according to FIG. 3. As a result, the time period for which the system is to wait after the read instruction READ is applied in the memory according to the invention is t2=t1−Δt. As a result, the clock frequency of the clock signal CLK can be increased, and the CAS latency CASL can continue to remain at two clock cycles. As is apparent from the signal diagram in FIG. 4, the outputting of the data group D1 via the connection area starts before the data group D2 is valid for outputting at the connection area. In order to obtain a maximum operating frequency, in the present exemplary embodiment the outputting of data is started as soon as the data group D1 is valid for outputting at the connection area. This is after the expiry of the time t2 after the application of the read instruction READ. As the data group D2 is output only with the falling edge of the clock signal CLK, a longer signal transit time in comparison with the data group D1 is not critical. Both data groups D1 and D2 can continue to be output within one clock cycle of the clock signal CLK.

We claim:

1. An integrated memory, comprising:
a plurality of memory cells arranged in a memory cell array having a first zone and a second zone;
a connection area for externally tapping data of said memory cells to be read out;
an output circuit connected between said memory cells and said connection area, said output circuit, during a memory access operation with prefetch:
receiving a first data group from said memory cells in said first zone and a second data group from said memory cells in said second zone in parallel; and
outputting the data of the first and second data groups successively in series via said connection area;
and an address decoder for defining said first and second zones for a plurality of memory access operations such that the first data group has a shorter signal transit time to said connection area than the second data group.

2. The integrated memory according to claim 1, wherein said address decoder defines the first and second zones such that said memory cells storing the first data group are arranged physically closer to said connection area than said memory cells storing the second data group.

3. The integrated memory according to claim 1, wherein said output circuit is driven to output data of the first data group before the second data group is valid for outputting at said connection area.

4. The integrated memory according to claim 1, wherein respective register circuits for buffering the data groups prior to external output are disposed in said connection area, and one of said register circuits is driven by a control signal to output data as soon as the first data group is valid at the respective said register circuit.

5. In an integrated memory having memory cells arranged in a memory cell array and a connection area connected to the memory cells for externally reading out data of the memory cells, a method of operating the memory in a prefetch architecture, which comprises:
defining a first zone and a second zone of the memory cell array;
during a memory access operation, feeding a first data group of memory cells from the first zone and a second data group of memory cells from the second zone of the memory cell array in parallel to an output circuit, and outputting the first and second data groups successively via the connection area; and
thereby defining the first and second zones for a plurality of memory access operations such that the first data group has a shorter signal transit time to the connection area than the second data group.

6. The method according to claim 5, wherein the defining step comprises defining the first and second zones such that the memory cells containing the first data group are disposed physically closer to the connection area than the memory cells containing the second data group.

7. The method according to claim 5, which comprises outputting via the connection area before the second data group is valid for outputting at the connection area.

8. The method according to claim 5, which comprises starting the outputting via the connection area as soon as the first data group is valid for outputting at the connection area.

9. The method according to claim 5, which comprises outputting the first and second data groups externally via the connection area within one clock cycle of a clock signal.

* * * * *